United States Patent
Bourdel et al.

(10) Patent No.: US 10,608,622 B2
(45) Date of Patent: Mar. 31, 2020

(54) SPECTRAL SPREAD FOR ELECTRIC MOTOR

(71) Applicant: Valeo Systemes Thermiques, Le Mesnil Saint Denis (FR)

(72) Inventors: Philippe Bourdel, Le Mesnil Saint-Denis (FR); Xavier Goumain, Le Mesnil Saint-Denis (FR); Jonathan Fournier, Le Mesnil Saint-Denis (FR); Sylvain Grandyot, Le Mesnil Saint-Denis (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 0 days.

(21) Appl. No.: 16/072,022

(22) PCT Filed: Jan. 25, 2017

(86) PCT No.: PCT/FR2017/050165
§ 371 (c)(1),
(2) Date: Jul. 23, 2018

(87) PCT Pub. No.: WO2017/129902
PCT Pub. Date: Aug. 3, 2017

(65) Prior Publication Data
US 2019/0081620 A1    Mar. 14, 2019

(30) Foreign Application Priority Data

Jan. 26, 2016   (FR) .................................... 16 50589

(51) Int. Cl.
*H03K 7/08*     (2006.01)
*H02P 21/26*    (2016.01)
(Continued)

(52) U.S. Cl.
CPC ............... *H03K 7/08* (2013.01); *H02P 21/22* (2016.02); *H02P 21/26* (2016.02); *H02M 1/14* (2013.01); *H02M 1/44* (2013.01)

(58) Field of Classification Search
CPC . H02P 21/22; H02P 21/26; H02P 8/34; H03K 7/08
See application file for complete search history.

(56) References Cited

U.S. PATENT DOCUMENTS 5,959,431 A * 9/1999 Xiang ................ H02P 23/0004
318/811
8,439,126 B2 * 5/2013 Bosch ....................... H02M 1/44
173/176

(Continued)

FOREIGN PATENT DOCUMENTS

EP     0 892 498 A1    1/1999
WO    2011/001232 A2    1/2011

OTHER PUBLICATIONS

International Search Report issued in PCT/FR2017/050165 dated May 2, 2017 (2 pages).

(Continued)

*Primary Examiner* — Thai T Dinh
(74) *Attorney, Agent, or Firm* — Osha Liang LLP (57) ABSTRACT

A method of control of an electric motor involves generation of an electrical control signal for the electric motor, the signal having a series of sequences of pulses, each pulse being defined by a width and a period. The ratio of width to period defines a mean electrical power provided to the electric motor by this pulse. The period of a pulse situated at an arbitrary position of a sequence of pulses is equal to the period of the pulse situated at that position of any other sequence of pulses of the series, and the period of each pulse is fixed in a pseudo random manner, such that the inverse of the fixed period lies above the audible acoustic spectrum.

(Continued)

The number of pulses of each sequence is fixed so that the inverse of the sum of the periods of all the pulses lies below the audible acoustic spectrum.

10 Claims, 6 Drawing Sheets

(51) Int. Cl.
    *H02P 21/22*     (2016.01)
    *H02M 1/44*     (2007.01)
    *H02M 1/14*     (2006.01)

(56)     References Cited

U.S. PATENT DOCUMENTS

| | | | |
|---|---|---|---|
| 8,912,742 B2 * | 12/2014 | Ohsugi | H02P 27/08 318/400.24 |
| 9,312,779 B2 * | 4/2016 | Liu | H02P 21/0003 |
| 9,374,028 B2 * | 6/2016 | Nondahl | H02P 6/181 |
| 2005/0069301 A1 | 3/2005 | Gallagher et al. | |
| 2010/0020573 A1 | 1/2010 | Melanson | |
| 2013/0200828 A1 | 8/2013 | Miller et al. | |

OTHER PUBLICATIONS

Written Opinion of the International Searching Authority issued in PCT/FR2017/050165 dated May 2, 2017 (6 pages).

\* cited by examiner

SPECTRAL SPREAD FOR ELECTRIC MOTOR

The subject of the description is in particular a method of control of an electric motor, in particular a brushless electric motor. This may entail in particular a brushless electric motor of the type of those used in automotive vehicles to propel the fans of the cabin of said vehicles, which are typically permanent-magnet synchronous motors, and are often three-phase.

In an electric motor furnished with brushes, a rotating collector ensures the commutations required to drive coils (forming electromagnets) via the brushes. The brushes posing servicing and performance problems, brushless electric motors have been designed.

The driving of brushless electric motors (also called electronic-commutation motors) involves, because of the absence of brushes and of rotating collector, an electronic control system to ensure the commutation of the current in the windings (the coils). The electronic control system usually comprises an electrical signals generator. These electrical signals, intended to transmit power to the electric motor, are customarily pulse width modulated (PWM for "Pulse Width Modulation"). PWM consists in generating a logic signal (0 or 1) with a period which may be fixed but with a variable duty cycle. The mean of the output signal is equal to the duty cycle. By thus applying a succession of discrete states for well-chosen durations, it is possible to obtain, averaged over a certain duration, any intermediate value.

PWM is liable to pose problems with EMC (electromagnetic compatibility). Indeed, the fact of modulating a signal at a given frequency is liable to generate electromagnetic glitches because of this frequency. In particular, a fixed-period PWM generates electromagnetic waves at frequencies which are multiples of the fundamental frequency driving the PWM. Thus, electromagnetic glitches in bands lying in the [0 MHz; 1 MHz] range and more particularly in the [0 kHz; 125 kHz] band (used by RFID chips associated with certain sensors) as well as in bands of the AM frequencies, disturbing the reception of radiophonic emissions, have been noted for automobile HVAC fan motors driven by PWM. HVAC is an acronym standing for the expression "Heating Ventilation and Air Conditioning".

In order to reduce such glitches, a spectral spreading technique for improving EMC has been proposed by the Valeo company (in particular in its patent application US20050069301, "Reduction of interference caused by PWM motors"). PWM can thus be improved to reduce the glitches, in particular in the AM frequencies and the [0 kHz; 125 kHz] band. The AM frequencies are customarily liable to use three frequency bands. A first band termed LW (long wave), a second band termed MW (medium wave) and a third band termed SW (short wave). The LW and MW bands, which are most liable to be disturbed, lie between 150 kHz and 2 MHz. The [0 kHz; 125 kHz] band used by certain sensors associated with RFID chips (such as a tire pressure sensor) is likewise liable to be disturbed. However, this technique is liable to introduce acoustic glitches, in frequencies of the audible spectrum, which conventionally extends from 20 Hz to 20 kHz (even if it is exceptional for a human to perceive the totality of this spectrum). The acoustic spectrum actually audible to a human being depends on the human being considered.

The invention is aimed at improving the situation.

The invention pertains in particular to a method of control of an electric motor, comprising:

generation, by an electronic control circuit, of an electrical control signal for the electric motor, said electrical signal comprising a series of sequences of pulses, each pulse of the series of sequences of pulses being defined by its width and by its period, the ratio of the width of a pulse to the period of this pulse defining a mean electrical power provided to the electric motor by this pulse, all the sequences of pulses of the series of sequences of pulses comprising an identical number of pulses, the period of a pulse situated at an arbitrary position of a sequence of pulses of the series of sequences of pulses being equal to the period of the pulse situated at said position of any other sequence of pulses of the series of sequences of pulses, the period of each pulse of a sequence of pulses of the series of sequences of pulses being fixed in a pseudo random manner, in a range of values such that the inverse of the period thus fixed in a pseudo random manner lies above the acoustic spectrum audible to a human being, the number of pulses of each sequence of pulses of the series of sequences of pulses being fixed in such a way that the inverse of the sum of the periods of all the pulses of each sequence of pulses of the series of sequences of pulses lies below the acoustic spectrum audible to a human being.

The invention pertains in particular to a method of control of an electric motor, in which the range of values in which the period of each pulse of a sequence of pulses of the series of sequences of pulses is fixed has as upper bound the inverse of 13 kHz.

The invention pertains in particular to a method of control of an electric motor, in which the range of values in which the period of each pulse of a sequence of pulses of the series of sequences of pulses is fixed has as lower bound the inverse of 20 kHz.

The invention pertains in particular to a method of control of an electric motor, the electric motor being furnished with a measurement receiver, the measurement receiver exhibiting a given measurement time, in which the sum of the periods of all the pulses of each sequence of pulses of the series of sequences of pulses is greater than or equal to the measurement time of the measurement receiver.

The invention pertains in particular to a method of control of an electric motor, in which each sequence of pulses of the series of sequences of pulses comprises 810 pulses.

The invention pertains in particular to a method of control of an electric motor, comprising a parallel generation of several electrical control signals for the electric motor, each electrical signal being generated by a method according to the invention.

The invention pertains in particular to a method of control of an electric motor, comprising a parallel generation of six control signals for the electric motor.

The invention pertains in particular to an electronic control circuit for an electric motor, comprising an electrical control signal generator for the electric motor, said electrical signal comprising a series of sequences of pulses, each pulse of the series of sequences of pulses being defined by its width and by its period, the ratio of the width of a pulse to the period of this pulse defining a mean electrical power provided to the electric motor by this pulse, all the sequences of pulses of the series of sequences of pulses comprising an identical number of pulses, the period of a pulse situated at an arbitrary position of a sequence of pulses of the series of sequences of pulses being equal to the period of the pulse situated at said position of any other sequence of pulses of the series of sequences of pulses, the period of each pulse of a sequence of pulses of the series of sequences of pulses being fixed in a pseudo random manner, in a range of values such that the inverse of the period thus fixed in a pseudo random manner lies above the acoustic spectrum audible to a human being, the number of pulses of each sequence of pulses of the series of sequences of pulses being fixed in such a way that the inverse of the sum of the periods of all the pulses of each sequence of pulses of the series of sequences of pulses lies below the acoustic spectrum audible to a human being.

The invention pertains in particular to a computer program comprising a series of instructions which, when they are executed by a processor, implement a method according to the invention.

The invention pertains in particular to a non-transient storage medium readable by computer storing a computer program according to the invention.

Other characteristics and advantages of the invention will become apparent on reading the description which follows. The latter is purely illustrative and should be read with regard to the appended drawings in which.

Figure 1:
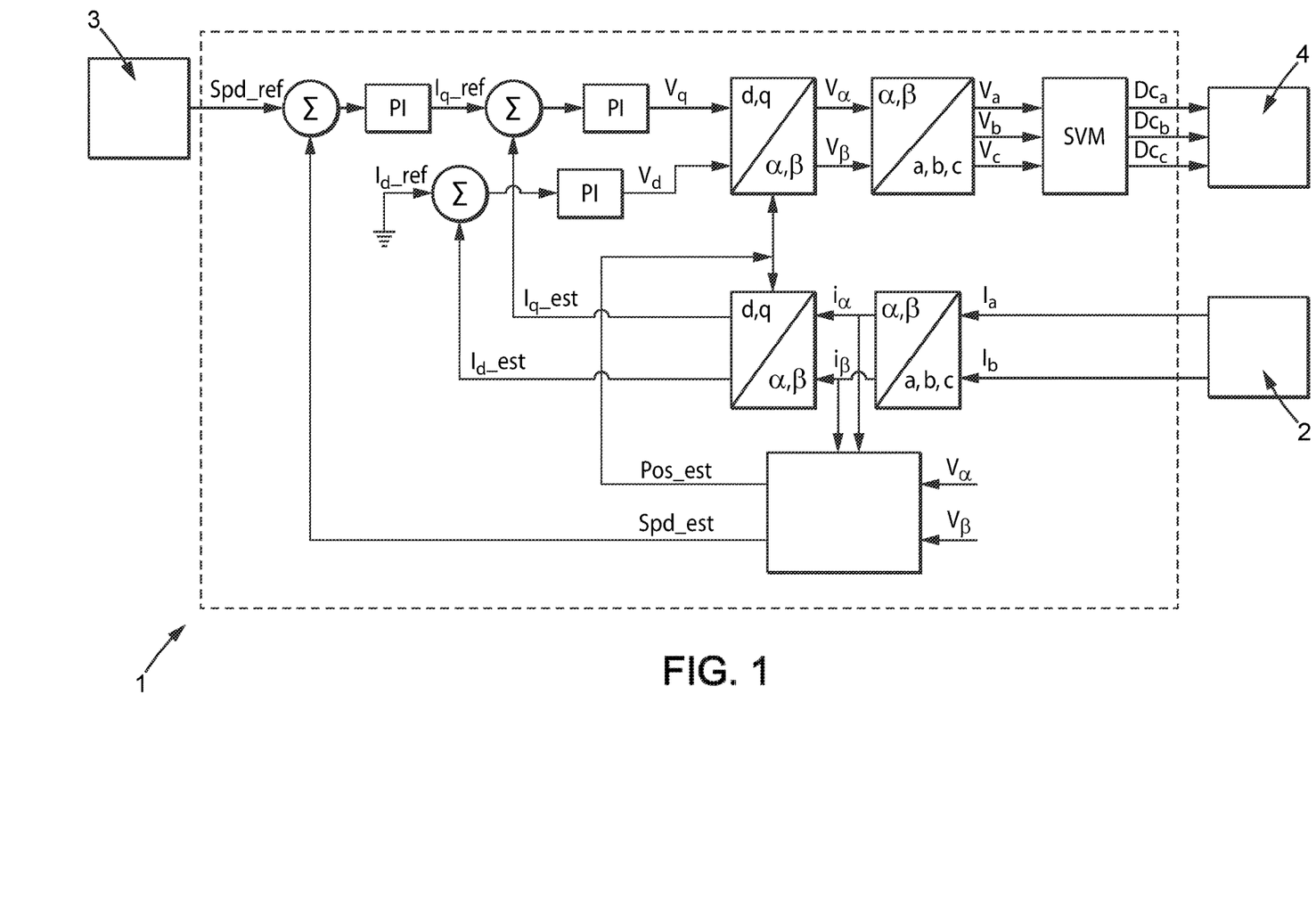
FIG. 1 represents in a schematic manner the functional characteristics of an electronic control circuit for an electric motor according to the prior art.

FIG. 1 represents in a schematic manner the functional characteristics of an electronic control circuit 1 of a known electric motor. The control of the synchronous motor is carried out by vector control according to an FOC ("Field Oriented Control") scheme which is well known. To be capable of regulating the speed of the motor, the electronic circuit comprises software which carries out the set of mathematical processings represented by rectangles in FIG. 1, at fixed time intervals. In the example of FIG. 1, this interval is 61 µs. This time interval of 61 µs is dictated by the PWM outputs. These PWM outputs being refreshed at this period of 61 µs, it is necessary to implement a new command before each updating of the PWM outputs.

A current sensor 2 measures the current which flows in the phases of the stator. The measurement of current forms the subject of diverse known processings (change of coordinate systems, estimation of the current in the rotor, change of coordinates of said current, etc.).

An interface 3 for controlling the speed of the motor receives speed setpoints and transmits them to the circuit 1.

The circuit 1, on the base on the one hand of the rotor position estimated via the current measurements and on the other hand of the setpoints received, dispatches a control signal to a circuit for driving MOSFET transistors 4.

The circuit 1 operates at regular time intervals of 61 µs, thereby generating electromagnetic glitches.

Figure 2:
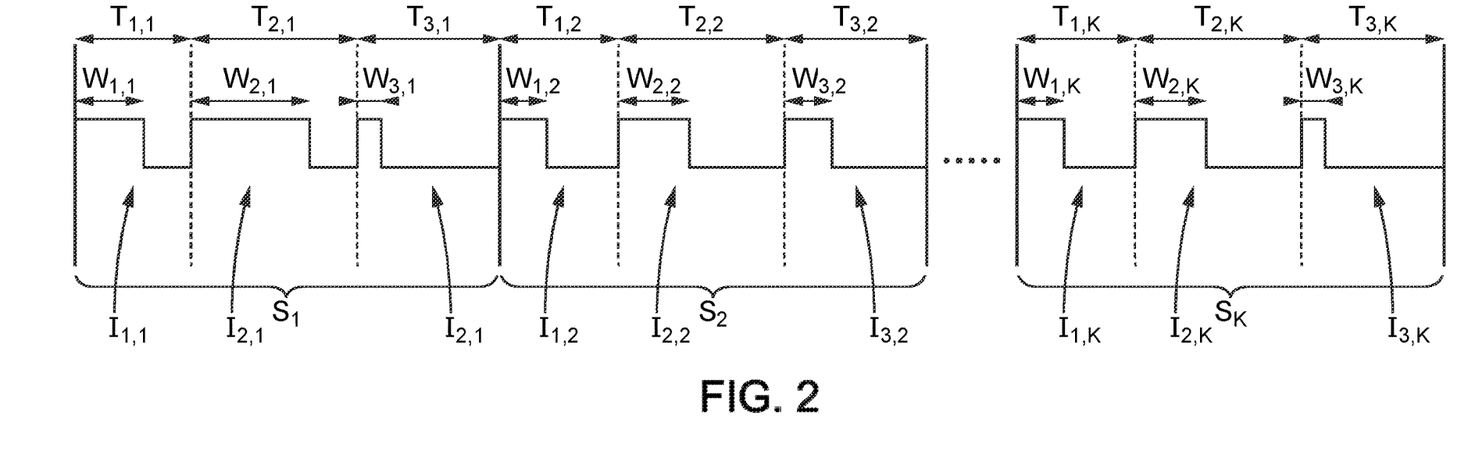
FIG. 2 represents an electric motor electrical control signal according to one embodiment of the invention.

FIG. 2 represents an electric motor electrical control signal according to one embodiment of the invention. The signal represented is schematic. It comprises only three pulses per sequence, which is not realistic (a number of 810 pulses per sequence would be more appropriate but is not easily representable graphically). FIG. 2 thus represents a series of sequences comprising at least three sequences $S_1$, $S_2$ and $S_K$ (the intermediate sequences between $S_2$ and $S_K$ are not represented). Each sequence comprises three pulses. The sequence $S_1$ thus comprises three pulses $I_{1,1}$, $I_{2,1}$ and $I_{3,1}$, the sequence $S_2$ comprises three pulses $I_{1,2}$, $I_{2,2}$ and $I_{3,2}$, and the sequence $S_K$ comprises three pulses $I_{1,K}$, $I_{2,K}$ and $I_{3,K}$. Each pulse is characterized by its width $W_{i,j}$ and by its period $T_{i,j}$, i lying between 1 and 3 and j lying between 1 and infinity (K being the last value represented, but the motor can rotate without limitation of duration, as long as it is not worn out).

The periodicity of the periods $T_{i,j}$ is observed. It is thus noted that $T_{1,1}=T_{1,2}=T_{1,K}$, that $T_{2,1}=T_{2,2}=T_{2,K}$, and that $T_{3,1}=T_{3,2}=T_{3,K}$. On the other hand, the modulated information (defined for each pulse $I_{i,j}$ by the duty cycle $W_{i,j}/T_{i,j}$) does not exhibit any particular periodicity.

Figure 3:
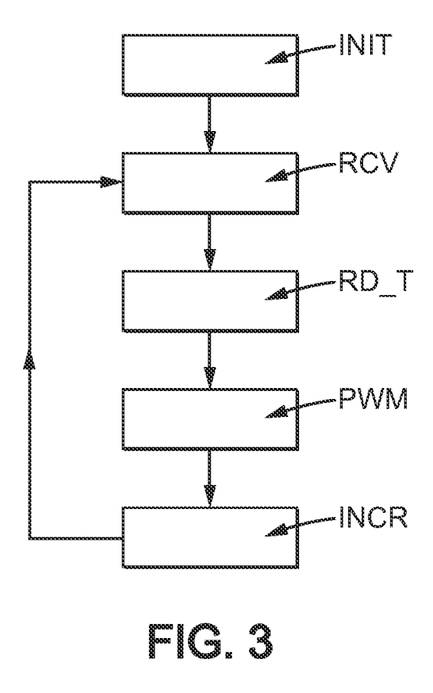
FIG. 3 represents in a schematic manner a method of control of an electric motor according to one embodiment of the invention.

FIG. 3 represents in a schematic manner a method of control of an electric motor according to one embodiment of the invention.

The method comprises firstly an initialization step INIT. This step can be implemented in particular during power-up of the motor, or in the case of restarting. During this initialization, the method can generate a table of random periods for a sequence of reference pulses. In the case represented in FIG. 2, this would amount to generating three random numbers, $R_1$, $R_2$ and $R_3$, with $R_1=T_{1,1}=T_{1,2}=T_{1,K}$, $R_2=T_{2,1}=T_{2,2}=T_{2,K}$ and $R_3=T_{3,1}=T_{3,2}=T_{3,K}$. But these random numbers may alternatively have been generated previously and have been stored for example in a ROM memory installed in the electric motor during its manufacture. The initialization step also comprises the initialization of a counter i, for example to zero (which is an arbitrary value chosen for its simplicity, but other values are possible, on condition the algorithm is modified accordingly).

The method then begins an infinite loop commencing with a step RCV of receiving a motor control setpoint.

Then comes a step RD_T of reading a period in the table of random periods, at the index i+1. During the first pass, the method therefore reads the value $R_1=T_{1,1}=T_{1,2}=T_{1,K}$.

This step is followed by a PWM step of generating a pulse width modulated pulse, in the course of which the method determines, as a function of the setpoint received in the step RCV and of the current period read in the step RD_T, the width of the pulse. In a simple scenario, the setpoint directly specifies the desired duty cycle. The method then makes do with multiplying the duty cycle received in the step RCV by the period to be used, read from the table in the step RD_T. Other means of calculation are possible. The method then generates the pulse that it has determined destined for a power transistor, via if relevant a transistor driving circuit.

Then comes a step INCR of modular incrementation of the index i. The method calculates i=i+1 mod N, N designating the number of pulses per sequence (N=3 in FIG. 2). The iterative procedure then repeats to infinity by returning to the step RCV.

Figure 4:
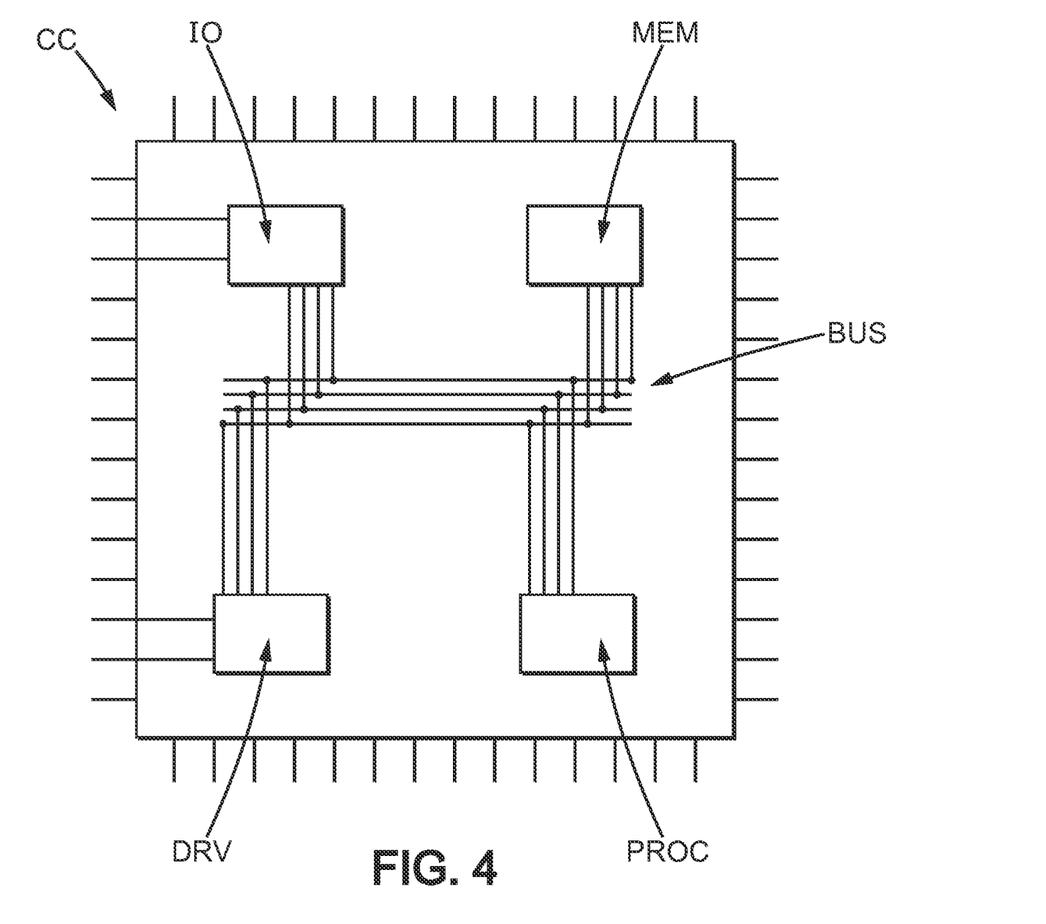
FIG. 4 represents in a schematic manner an electronic control circuit for an electric motor according to one embodiment of the invention.

FIG. 4 represents in a schematic manner an electronic control circuit for an electric motor according to one embodiment of the invention. The electronic circuit comprises in one and the same housing a microprocessor PROC and a memory MEM storing a computer program according to one embodiment of the invention. The electronic circuit also comprises in this same housing an inputs-outputs 10 interface for receiving motor control setpoints, as well as a power transistors drive circuit DRV. The processor PROC, the memory MEM, the inputs-outputs circuit 10 and the drive circuit DRV are linked by a bus BUS internal to the housing. The inputs-outputs circuit 10 and the drive circuit DRV are each connected to pins of the housing, thereby allowing interconnection of the housing with the outside world.

When it executes the program stored in the memory MEM (which is for example a memory of ROM type, the acronym standing for "Read Only Memory"), the processor PROC is directed to periodically receive setpoints via the inputs-outputs IO interface, and as a function of these setpoints, it dispatches a control signal according to the invention via the drive circuit DRV to power transistors so as to control the operation of the electric motor.

According to a possible variant, the aforementioned memory is integrated with the aforementioned processor, within a microcontroller. According to a possible implementation of this variant, instead of one housing, two housings are provided, one of which comprises the microcontroller and the other comprises the drive circuit DRV (to drive MOSFET transistors controlling the electric motor).

Figure 5:
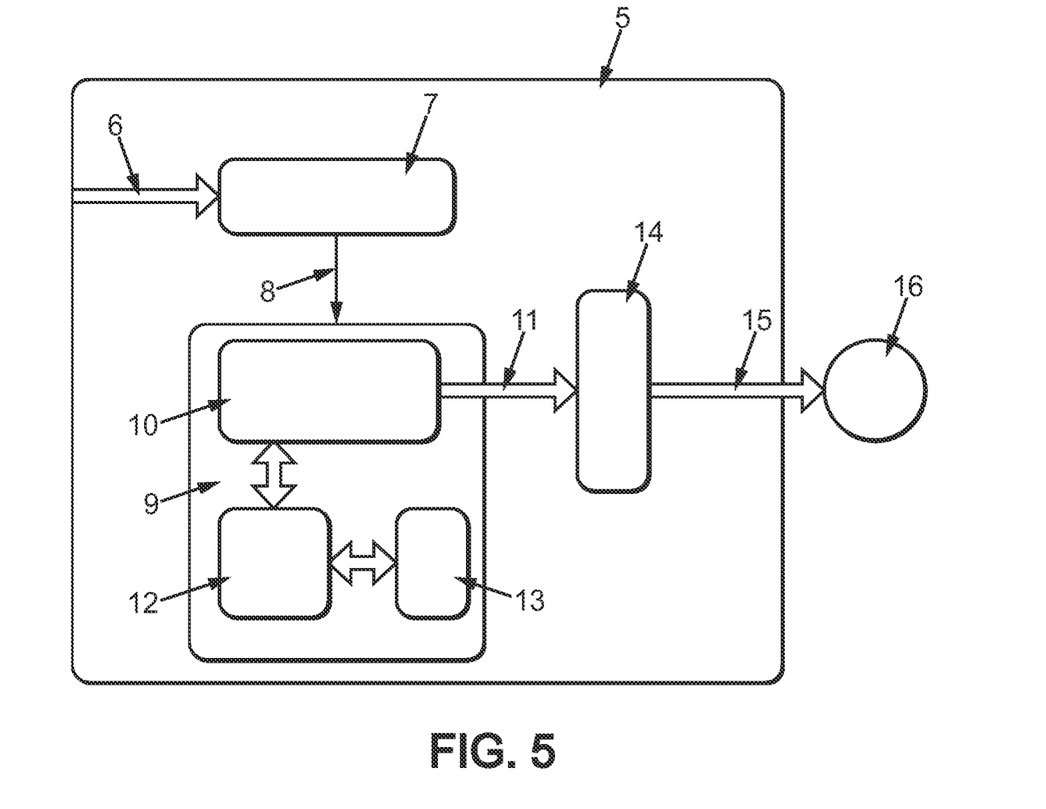
FIG. 5 illustrates in a schematic manner an electronic control circuit for an electric motor according to another embodiment of the invention.

FIG. 5 represents an embodiment in which a control circuit 5 receives an external command 6 via an inputs-outputs interface 7. This interface 7 then dispatches an internal command 8 to a microcontroller 9. The internal command 8 is received by an inputs-outputs interface 10 of the microcontroller. This interface 10 is designed to emit commands 11 making it possible to control a pulse width modulation (PWM) defining a signal which drives an electric motor. The interface 10 communicates with a memory 12 (such as a read-only memory) of the microcontroller 9, the memory comprising a computer program. This memory 12 itself communicates with a processor 13 of the microcontroller. This processor 13 is designed to execute a computer program stored in the memory 12. The commands 11 emitted by the interface 10 are received by a drive circuit 14, which emits motor commands 15 destined for an electric motor 16.

Figure 6:
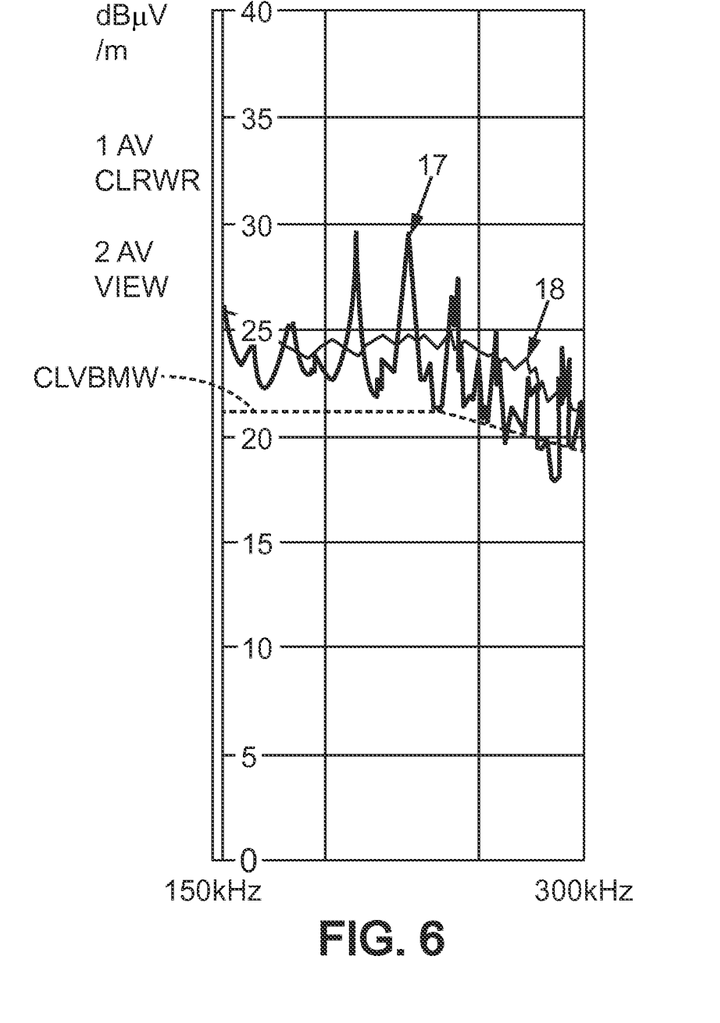
FIG. 6 compares a curve obtained with the aid of a spectral spreading according to one embodiment of the invention with a curve obtained according to the prior art.

FIG. 6 illustrates two curves, one illustrating the parasitic emissions measured with a control method according to the prior art, the other illustrating the parasitic emissions measured with a control method according to an embodiment of the invention. It is observed that the curve 17, obtained with a method according to the prior art comprising a chopping at 16.4 kHz, exhibits harmonics of 16.4 kHz, attaining almost (for two of them) 30 dBpV. On the contrary, in the curve 18, obtained according to an embodiment, the spectral spreading implemented removes the harmonics.

A first embodiment pertains to a method of control of an electric motor. The electric motor is for example PMSM motor (standing for permanent-magnet synchronous motor). It can be divested of position sensors (and estimate the position of the rotor in an algorithmic manner, for example on the basis of measurements of currents). It is for example three-phase. It is for example furnished with four pairs of poles. It is for example a 325 W motor (26 A at 12.5V). Such a motor is suitably adapted for example to operate an automotive vehicle cabin fan.

The method comprises generation, by an electronic control circuit, of an electrical control signal for the electric motor. According to a possible implementation, the electronic control circuit is made up of a single component. According to a possible implementation, the electronic control circuit is made up of a set of components. According to a possible implementation, the electronic control circuit is a programmable electronic circuit, for example of FPGA type. According to a possible implementation, the electronic control circuit comprises a processor (such as a DSP) and a memory containing a program which, when it is executed by the processor, directs the processor to implement the functions of the electronic control circuit according to the invention. The latter implementation is advantageous in that it makes it possible to implement the invention in certain motors of the prior art simply by loading a new computer program into the memory of this motor.

The electrical control signal is for example a PWM signal.

The electrical control signal controls for example a power transistor (such as a MOSFET power transistor) making it possible to deliver electrical power to the motor when the electrical control signal is at the logic level 1 (which according to a possible implementation corresponds to a physical level of 12V) and to not deliver any when the electrical control signal is at the logic level 0.

The electrical control signal comprises a series of sequences of pulses.

Each pulse comprises a signal portion during which the signal is at the logic level 1 and a signal portion during which the signal is at the logic level 0. According to a possible implementation, each pulse consists of a logic 1 signal portion for a certain duration followed by a logic 0 signal portion for another duration. According to a possible implementation, each pulse consists of a logic 0 signal portion for a certain duration followed by a logic 1 signal portion for another duration. According to a possible implementation, all the pulses of the electrical control signal each consist of a logic 1 signal portion for a certain duration followed by a logic 0 signal portion for another duration. According to a possible implementation, all the pulses of the electrical control signal each consist of a logic 0 signal portion for a certain duration followed by a logic 1 signal portion for another duration.

Each pulse of the series of sequences of pulses is defined by its width and by its period. The width of the pulse can be defined as the duration for which the signal portion representing the pulse remains at the logic level 1. The duration of the pulse can be defined as the total duration of the signal portion representing the pulse, which is the duration separating the start of the pulse from the start of the following pulse.

The ratio of the width of a pulse to the period of this pulse (called the duty cycle) defines a mean electrical power provided to the electric motor by this pulse. More precisely, this mean electrical power is proportional to this duty cycle. The higher the duty cycle, that is to say the closer the width of the pulse is to the duration of the pulse, the more the pulse delivers power to the motor.

All the sequences of pulses of the series of sequences of pulses comprise an identical number of pulses. For example, each sequence of pulses comprises N=810 pulses.

The period $T_{i,j}$ of a pulse $I_{i,j}$ situated at an arbitrary position Pi of a sequence of pulses $S_j = \{I_{1,j}; I_{2,j}; \ldots I_{i,j}; I_{N,j}\}$ of the series of sequences of pulses is equal to the period $T_{i,k}$ of the pulse $I_{i,k}$ situated at said position $P_i$ of any other sequence of pulses $S_k = \{I_{1,k}; I_{2,k}; \ldots I_{i,k}; \ldots I_{N,k}\}$ of the series of sequences of pulses. We thus have $T_{i,j} = T_{i,k}$ for any triplet $\{i,j,k\}$.

The period of each pulse of a sequence of pulses of the series of sequences of pulses is fixed in a pseudo random manner. According to a possible implementation, the random pseudo fixing of the aforementioned periods is carried out previously, for example during the manufacture of the motor (the method does not therefore have to generate these random periods). According to another implementation, the method is designed to generate the required random periods itself, which it can do for example during an initialization phase (for example each time the motor is powered up).

Thus, reusing the notation hereinabove, $T_{i1,j}$ is most of the time different from $T_{i2,j}$ irrespective of j, if i1 is different from i2, since the probability that two random pseudo values are equal is small. This pseudo-random character involves a spectral spreading which makes it possible to avoid generating glitches at a frequency equal to the inverse of the fixed period (in the case where the period is fixed instead of being pseudo random), as well as at multiples of this frequency. These glitches originate from the switching of the MOSFET transistors from the on state to the off state (or vice-versa), driven by the pulses. These glitches can comprise harmonics of the chopping, generated by the MOSFET transistors. But it is also appropriate to avoid acoustic glitches.

The period of each pulse of a sequence of pulses of the series of sequences of pulses is fixed in a pseudo random manner in a range of values such that the inverse of the period thus fixed in a pseudo random manner lies above the acoustic spectrum audible to a human being (or at the top of the acoustic spectrum). By "above the acoustic spectrum audible to a human being" is meant that the inverse of the period fixed in a pseudo random manner is greater than the upper bound of the acoustic spectrum audible to a human being. According to a possible implementation, the inverse of the period fixed in a pseudo random manner is greater than 20 kHz, but according to a variant, it may be greater than a frequency smaller than 20 kHz. The acoustic spectrum conventionally terminates at 20 kHz (this is its top bound), but this frequency of 20 kHz is not audible to most human beings. According to a possible implementation, the top of the acoustic spectrum is defined as the range of frequencies from 13 kHz to 19 kHz. Intermediate alternative ranges are possible (for example from 15 kHz to 20 kHz). The top of the acoustic spectrum is considered to be higher (in frequency) than the acoustic spectrum audible to a human being.

The number ne of pulses of each sequence of pulses of the series of sequences of pulses is fixed in such a way that the inverse of the sum of the periods of all the pulses of each sequence of pulses of the series of sequences of pulses lies below the acoustic spectrum audible to a human being (or at the bottom of the acoustic spectrum). By "below the acoustic spectrum audible to a human being" is meant that the inverse of the sum of the aforementioned periods is less than the lower bound of the acoustic spectrum audible to a human being. According to a variant, the inverse of the sum of the aforementioned periods is less than 20 Hz. The acoustic spectrum conventionally commences at 20 Hz, but this frequency of 20 Hz is not audible to numerous human beings who often poorly distinguish frequencies below 50 Hz. According to a possible implementation, the bottom of the acoustic spectrum is defined as the range of frequencies from 20 Hz to 50 Hz. Intermediate alternative ranges are possible (for example from 20 Hz to 35 Hz). The bottom of the acoustic spectrum is considered to be lower (in frequency) than the acoustic spectrum audible to a human being.

The method according to the first embodiment makes it possible to gain 3 to 5 dB in the LW band (first band of the AM modulation, lying between 150 kHz and 300 kHz, as illustrated in FIG. 6), without degrading the acoustic performance.

A second embodiment relates to a method of control of an electric motor according to the first embodiment, in which the range of values in which the period of each pulse of a sequence of pulses of the series of sequences of pulses is fixed has as upper bound the inverse of 13 kHz. This makes it possible to reduce the audible glitches, for most people.

A third embodiment pertains to a method of control of an electric motor according to the first or the second embodiment, in which the range of values in which the period of each pulse of a sequence of pulses of the series of sequences of pulses is fixed has as lower bound the inverse of 19 kHz. This lower limit is advantageous, since it corresponds to the limit of the calculation power available in microcontrollers for controlling motors of the prior art. Such microcontrollers in general have functions other than motor control, which functions also consume a part of their calculation power. Beyond 19 kHz, the real-time constraints are therefore customarily more difficult to comply with.

A fourth embodiment pertains to a method of control of an electric motor according to one of the first to the third embodiments. The electric motor is furnished with a measurement receiver, the measurement receiver exhibiting a given measurement time. The sum of the periods of all the pulses of each sequence of pulses of the series of sequences of pulses is greater than or equal to this measurement time, which is typically close to 50 ms (this also corresponding to the bottom limit of the acoustic spectrum). This is advantageous, since the sequences of pulses all have a similar structure. More precisely, the periods of the pulses contained in two arbitrary sequences are always the same (as set forth above, $T_{i,j}=T_{i,k}$ for any triplet $\{i,j,k\}$). The duty cycles of each pulse are admittedly liable to be different, but there nonetheless emerges from each sequence periodic elements (that are retrieved in each sequence), liable to create glitches at their frequency of occurrence and at multiples of this frequency. By employing sequences of length greater than or equal to 50 ms, the method ensures that the frequency of occurrence of the periodic elements (whose periodicity is related to the identical structure of the sequences) is less than $1/(50*10^{-3} \text{ s})=20$ Hz. However, a frequency of less than 20 Hz is outside the acoustic spectrum audible to a human being.

According to a fifth embodiment, each sequence of pulses of the series of sequences of pulses of a method of control of an electric motor according to the fourth embodiment comprises 810 pulses. This number of pulses results from the ratio of the duration of the sequence to the mean period of a pulse. Thus, for a sequence duration of 50 ms (which can be chosen so as to avoid audible glitches at the bottom of the acoustic spectrum and which also corresponds to the typical measurement time of conventional measurement receivers) and for pulses of a mean frequency of 16.2 kHz (so as also to avoid audible glitches, since humans do not customarily perceive such a frequency although it lies in the acoustic spectrum), we have 50*16.2=810 pulses per sequence. The period of each of these 810 pulses could be generated randomly on the fly, but this would often be overly penalizing from the point of view of the available calculation power. It is therefore advantageous to use predefined random periods.

According to a possible implementation, in an initialization phase, the method randomly generates 810 values of pulse periods such that the inverse of each of these values lies above the acoustic spectrum audible to a human being (for example above 13 kHz if it is accepted that few people perceive frequencies of greater than 13 kHz), and such that the sum of these values is substantially equal to 50 ms. According to a possible implementation, these 810 values are then stored in a table. During operation, the method then consults the table when it needs to know the period of the following pulse that it must generate. The method can thus maintain a counter of elements that are contained in the table. According to a possible implementation, it increments this counter modulo the size of the table (thereby introducing the desired periodicity, each sequence corresponding to a complete traversal of the table). According to another variant, instead of storing the 810 values (or any other appropriate number of values) in a table (within a memory which may be a nonvolatile memory, in particular of ROM, EEPROM or Flash type), the method generates, still in the course of an initialization phase, a state machine which stores the 810 values and allows passage from each value to the following value. Instead of resorting to an initialization phase, the method may rely on parameters predefined in the factory during the manufacture of an electronic control circuit for an electric motor designed to implement the method.

According to a sixth embodiment, a method of control of an electric motor comprises a parallel generation of several electrical control signals for the electric motor, each electrical signal being generated by a method according to one of the first to the fifth embodiments.

According to a seventh embodiment, a method of control of an electric motor according to the sixth embodiment comprises a parallel generation of six control signals for the electric motor. Thus, each of the parallel signals can for example control a distinct power transistor so as to drive the electric motor. The method can therefore control six transistors, each with its own electrical control signal. Each of the six signals is constructed according to a commutation diagram making it possible to drive the phases of the motor, thereby rotating the motor.

According to an eighth embodiment, an electronic control circuit for an electric motor comprises an electrical control signal generator for the electric motor. This generator is therefore a subset of the electronic control circuit. But according to a variant, the generator constitutes the electronic control circuit. According to a possible implementation, the generator is made up of a single component. According to a possible implementation, the generator is made up of a set of components. According to a possible implementation, the generator is a programmable electronic circuit, for example of FPGA type. According to a possible implementation, the generator comprises a processor (such as a DSP) and a memory containing a program which, when it is executed by the processor, directs the processor to implement the functions of the generator according to the invention.

The electrical control signal comprises a series of sequences of pulses.

Each pulse of the series of sequences of pulses is defined by its width and by its period.

The ratio of the width of a pulse to the period of this pulse defines a mean electrical power provided to the electric motor by this pulse.

All the sequences of pulses of the series of sequences of pulses comprise an identical number of pulses.

The period of a pulse situated at an arbitrary position of a sequence of pulses of the series of sequences of pulses is equal to the period of the pulse situated at said position of any other sequence of pulses of the series of sequences of pulses.

The period of each pulse of a sequence of pulses of the series of sequences of pulses is fixed in a pseudo random manner, in a range of values such that the inverse of the period thus fixed in a pseudo random manner lies above the acoustic spectrum audible to a human being.

The number of pulses of each sequence of pulses of the series of sequences of pulses is fixed in such a way that the inverse of the sum of the periods of all the pulses of each sequence of pulses of the series of sequences of pulses lies below the acoustic spectrum audible to a human being.

The characteristics of the first to the seventh embodiments pertaining to a method of control of an electric motor are transposable to the electronic control circuit for an electric motor according to the eighth embodiment, and vice versa.

According to a ninth embodiment, a computer program comprises a series of instructions which, when they are executed by a processor, implement a method according to one of the first to the seventh embodiments. The computer program can in particular be designed in assembler language, or in low-level language such as the C language.

According to a tenth embodiment, a non-transient storage medium readable by computer stores a computer program according to the ninth embodiment. The storage medium is for example a nonvolatile memory, such as a Flash, EEPROM, ROM memory, etc.

The invention claimed is:

1. A method of control of an electric motor, comprising:
   generation, by an electronic control circuit, of an electrical control signal for the electric motor, the electrical control signal comprising a series of sequences of pulses,
   each pulse of the series of sequences of pulses being defined by its width and by its period, the ratio of the width of a pulse to the period of this pulse defining a mean electrical power provided to the electric motor by this pulse,
   all the sequences of pulses of the series of sequences of pulses comprising an identical number of pulses,
   the period of a pulse situated at an arbitrary position of a sequence of pulses of the series of sequences of pulses being equal to the period of the pulse situated at said position of any other sequence of pulses of the series of sequences of pulses,
   the period of each pulse of a sequence of pulses of the series of sequences of pulses being fixed in a pseudo random manner, in a range of values such that the inverse of the period thus fixed in a pseudo random manner lies above the acoustic spectrum audible to a human being,
   the number of pulses of each sequence of pulses of the series of sequences of pulses being fixed in such a way that the inverse of the sum of the periods of all the pulses of each sequence of pulses of the series of sequences of pulses lies below the acoustic spectrum audible to a human being.

2. The method of control of an electric motor as claimed in claim 1, in which the range of values in which the period of each pulse of a sequence of pulses of the series of sequences of pulses is fixed has as upper bound the inverse of 13 kHz.

3. The method of control of an electric motor as claimed in claim 1, wherein the range of values in which the period of each pulse of a sequence of pulses of the series of sequences of pulses is fixed has as lower bound the inverse of 19 kHz.

4. The method of control of an electric motor as claimed in claim 1, the electric motor comprising a measurement receiver, the measurement receiver exhibiting a given measurement time in which the sum of the periods of all the pulses of each sequence of pulses of the series of sequences of pulses is greater than or equal to the measurement time of the measurement receiver.

5. The method of control of an electric motor as claimed in claim 4, in which each sequence of pulses of the series of sequences of pulses comprises 810 pulses.

6. A method of control of an electric motor, comprising:
a parallel generation of several electrical control signals for the electric motor, each electrical signal being generated by a method as claimed in claim 1.

7. The method of control of an electric motor as claimed in claim 6, comprising a parallel generation of six control signals for the electric motor.

8. A computer program comprising a series of instructions which, when they are executed by a processor, implement a method as claimed in claim 1.

9. A non-transient storage medium readable by computer storing a computer program as claimed in claim 8.

10. An electronic circuit for control of an electric motor, comprising:
an electrical control signal generator for the electric motor, said electrical control signal comprising a series of sequences of pulses,
each pulse of the series of sequences of pulses being defined by its width and by its period, the ratio of the width of a pulse to the period of this pulse defining a mean electrical power provided to the electric motor by this pulse,
all the sequences of pulses of the series of sequences of pulses comprising an identical number of pulses,
the period of a pulse situated at an arbitrary position of a sequence of pulses of the series of sequences of pulses being equal to the period of the pulse situated at said position of any other sequence of pulses of the series of sequences of pulses,
the period of each pulse of a sequence of pulses of the series of sequences of pulses being fixed in a pseudo random manner, in a range of values such that the inverse of the period thus fixed in a pseudo random manner lies above the acoustic spectrum audible to a human being,
the number of pulses of each sequence of pulses of the series of sequences of pulses being fixed in such a way that the inverse of the sum of the periods of all the pulses of each sequence of pulses of the series of sequences of pulses lies below the acoustic spectrum audible to a human being.

* * * * *